United States Patent
Sarin

(10) Patent No.: US 7,619,933 B2
(45) Date of Patent: Nov. 17, 2009

(54) REDUCING EFFECTS OF PROGRAM DISTURB IN A MEMORY DEVICE

(75) Inventor: Vishal Sarin, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 52 days.

(21) Appl. No.: 11/868,042

(22) Filed: Oct. 5, 2007

(65) Prior Publication Data

US 2009/0091973 A1    Apr. 9, 2009

(51) Int. Cl.
*G11C 16/04*    (2006.01)

(52) U.S. Cl. .............................. 365/185.28; 365/185.02; 365/185.18; 365/185.33

(58) Field of Classification Search ............. 365/185.02, 365/185.28
See application file for complete search history.

(56) References Cited

U.S. PATENT DOCUMENTS

| | | | | |
|---|---|---|---|---|
| 5,295,106 A * | 3/1994 | Jinbo | ........................ | 365/218 |
| 5,491,657 A * | 2/1996 | Haddad et al. | ......... | 365/185.27 |
| 5,661,683 A * | 8/1997 | Song | ..................... | 365/185.18 |
| 5,715,194 A * | 2/1998 | Hu | ........................ | 365/185.17 |
| 6,061,270 A * | 5/2000 | Choi | ..................... | 365/185.02 |
| 6,477,088 B2 * | 11/2002 | Ogura et al. | ........... | 365/185.29 |
| 6,731,544 B2 * | 5/2004 | Han et al. | .............. | 365/185.28 |
| 6,747,899 B2 * | 6/2004 | Hsia et al. | .............. | 365/185.28 |
| 6,807,104 B2 * | 10/2004 | Arai et al. | .............. | 365/185.24 |
| 6,956,770 B2 * | 10/2005 | Khalid et al. | .......... | 365/185.12 |
| 7,057,931 B2 | 6/2006 | Lutze et al. | | |
| 7,139,198 B2 | 11/2006 | Guterman et al. | | |
| 7,212,435 B2 * | 5/2007 | Rudeck et | ............. | 365/185.02 |
| 7,254,084 B2 * | 8/2007 | Terasawa et al. | ........... | 365/229 |
| 7,298,651 B2 * | 11/2007 | Zhang | ................... | 365/185.16 |
| 7,433,233 B2 * | 10/2008 | Chen et al. | .............. | 365/185.17 |
| 2001/0050442 A1 * | 12/2001 | Lee | ........................... | 257/903 |
| 2002/0118569 A1 * | 8/2002 | Jeong et al. | ............ | 365/185.18 |
| 2004/0233725 A1 | 11/2004 | Iwase et al. | | |
| 2005/0243602 A1 * | 11/2005 | Umezawa | .............. | 365/185.11 |
| 2005/0254309 A1 * | 11/2005 | Kwon et al. | ........... | 365/185.28 |
| 2007/0109870 A1 * | 5/2007 | Kurata et al. | ........... | 365/185.28 |

\* cited by examiner

*Primary Examiner*—Son L Mai
(74) *Attorney, Agent, or Firm*—Leffert Jay & Polglaze, P.A.

(57) ABSTRACT

The programming disturb effects in a semiconductor non-volatile memory device are reduced by biasing unselected word lines of a memory block with a negative voltage followed by a positive $V_{pass}$ voltage. The selected word lines are biased with a programming voltage. In one embodiment, the programming voltage is preceded by a negative voltage.

16 Claims, 5 Drawing Sheets

REDUCING EFFECTS OF PROGRAM DISTURB IN A MEMORY DEVICE

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NAND" and "NOR" architectures. These architectures are named for the resemblance that the basic memory cell configuration of each architecture has to a basic NAND or NOR gate circuits, respectively.

In the NOR array architecture, the floating gate memory cells of the memory array are arranged in a matrix. The control gates of each floating gate memory cell of the array matrix are connected to select lines (which are often referred to as rows and/or word lines) and their drains are connected to column bit lines. The source of each floating gate memory cell is typically connected to a common source line. The NOR architecture floating gate memory array is accessed by a row decoder activating a row of floating gate memory cells by selecting the word line connected to their control gates. The row of selected memory cells then place their stored data values on the column bit lines by flowing a differing current if in a programmed state or not programmed state from the connected source line to the connected column bit lines.

FIG. 1 shows a portion of a typical prior art NAND flash memory array. The selected word line 100 for the flash memory cells being programmed is typically biased by programming pulses that start at a voltage of around 16V and may incrementally increase to more than 20V. The selected word line 100 of the cells 101-103 to be programmed is biased at 19V. The unselected word lines for the remaining cells are biased at $V_{pass}$. This is typically in an approximate range of 9-10V. The bit lines of the cells 101-103 to be programmed are biased at 0V while the other bit lines are inhibited (i.e., biased at $V_{CC}$).

As NAND flash memory is scaled, parasitic capacitance coupling between the selected word line and adjacent word lines becomes problematic. Because of the parasitic coupling, the neighboring cells are more prone to program disturb than the other cells that also share the common bit line with the cells being programmed. This causes the cells on neighboring wordlines to experience program disturb.

The program disturb condition has two operation modes: boosting mode and $V_{pass}$ mode. During the boosting mode, the cell's channel is at a positive boosting voltage (e.g., 6V) with respect to the gate and the gate is at $V_{pgm}$ (e.g., 19V). During the $V_{pass}$ mode, the cell's channel is at ground and the gate is at $V_{pass}$ (e.g., 10V). In FIG. 1, the cells 120, 121 on the selected word line 100 and inhibited bit lines are influenced by boosting mode program disturb. The neighboring cells 110-118 that are coupled to the enabled bit lines experience $V_{pass}$ mode program disturb.

Increasing $V_{pass}$ to try to reduce the disturb condition actually makes the condition worse for some cells. For example, the source and drain regions of one uninhibited bit line of memory cells 103, 112, 115, and 118 are coupled to 0V due to the 0V program biasing on the bit line. If $V_{pass}$ is only 10V on the unselected word lines, the source and drain regions are coupled to 9V. However, if $V_{pass}$ were raised to a higher voltage (e.g., 15V), the source/drain regions would also be coupled up to a higher voltage, thus increasing the program disturb on that bit line.

Program disturb is also degraded as the number of program/erase cycles increase. As the quantity of program/erase cycles increase, the voltage difference between the programmed state and the erased state narrows. This makes the affected cells more susceptible to over-programming as the threshold voltage distributions narrow.

For the reasons stated above, and for other reasons stated below which will become apparent to those skilled in the art upon reading and understanding the present specification, there is a need in the art for a way to reduce the effects of program disturb in a memory device.

DETAILED DESCRIPTION

Figure 1:
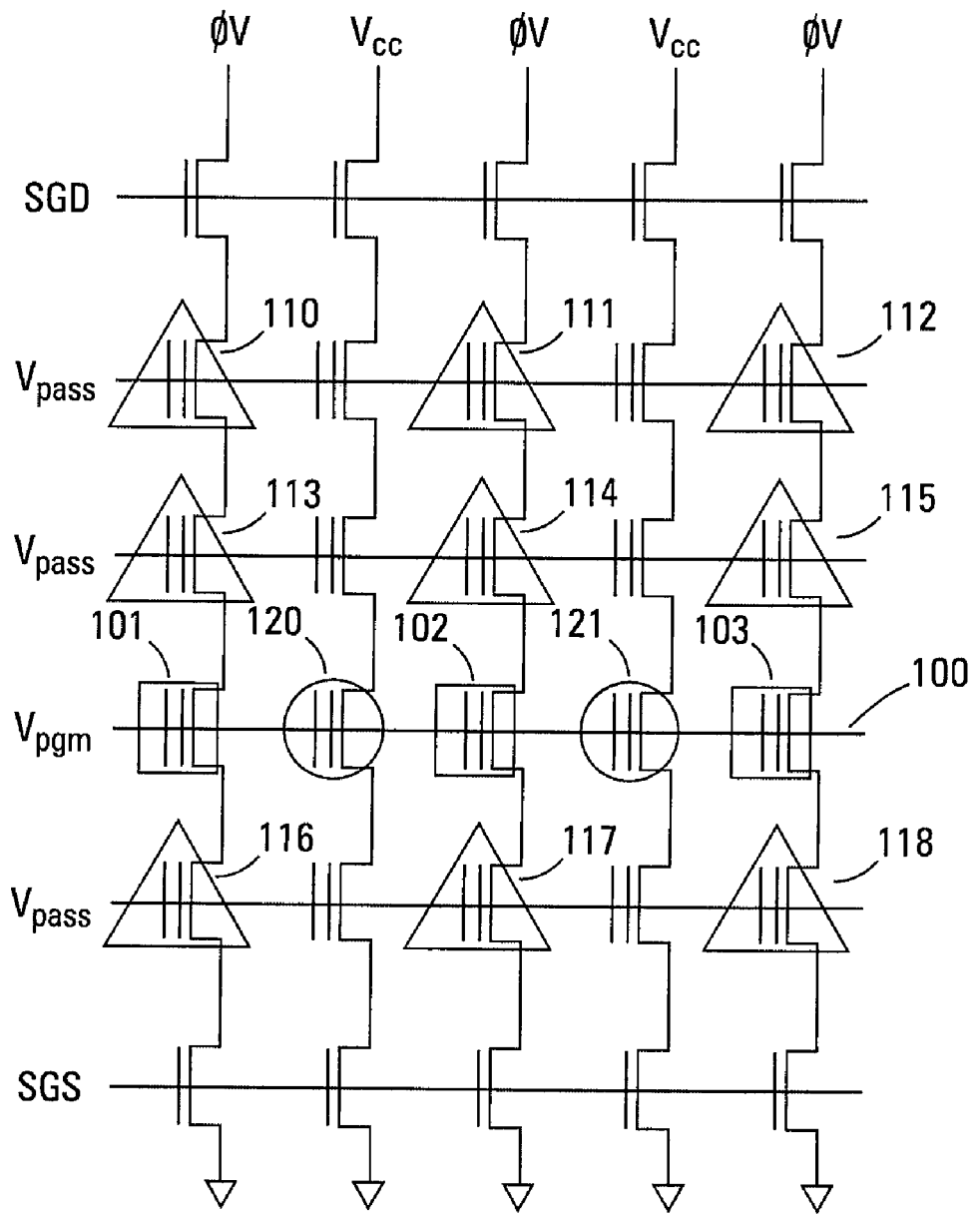
FIG. 1 shows a typical prior art NAND architecture memory array with word line biasing.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
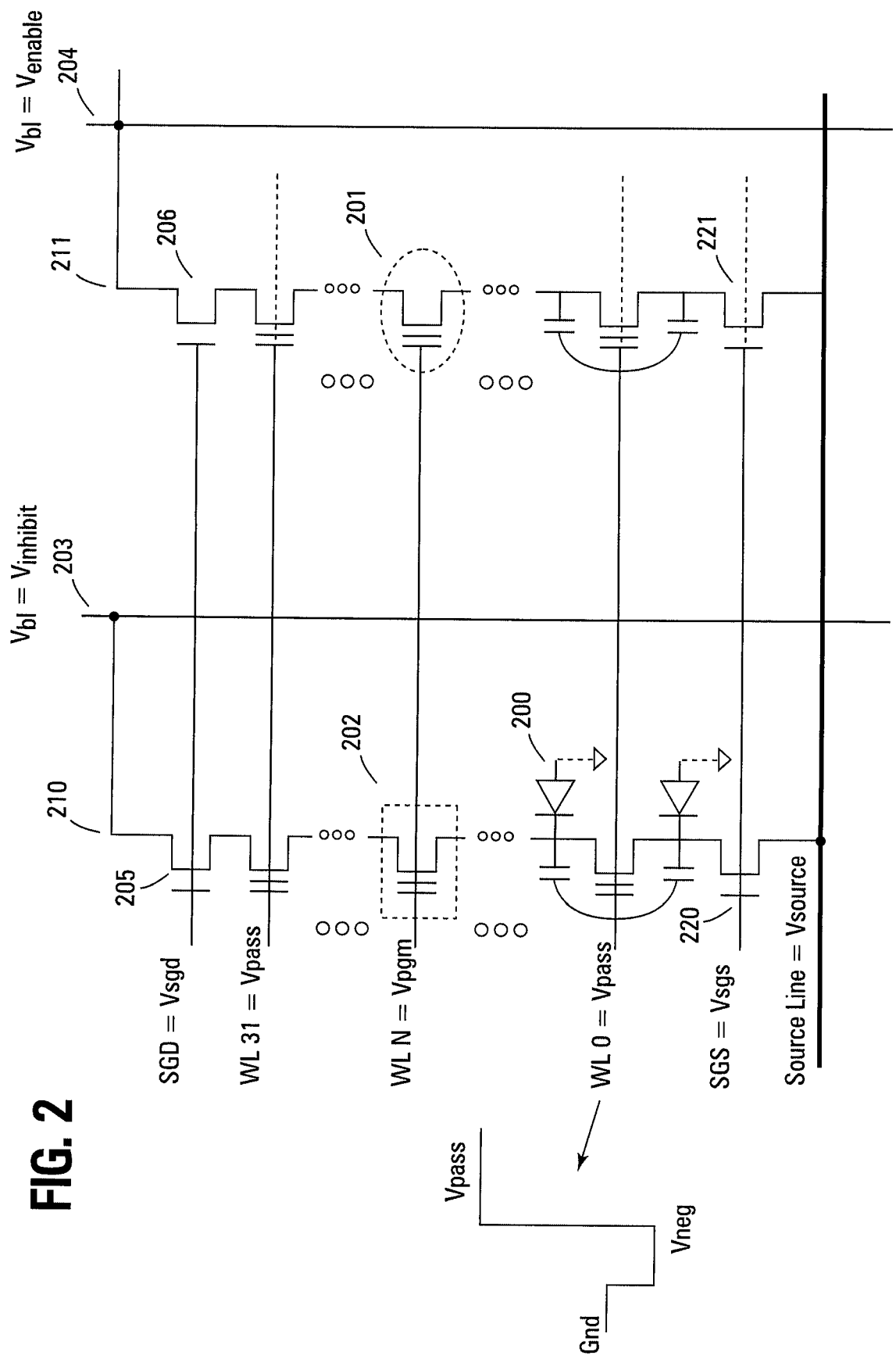
FIG. 2 shows a schematic diagram of a portion of a memory array of the present disclosure.

FIG. 2 illustrates a schematic of a portion of a memory array. This figure shows two series strings of memory cells 210, 211 that are each coupled to their respective bit lines 203, 204. Each series string 210, 211 is coupled to its respective bit line 210, 211 through a select gate drain transistor 205, 206. Each series string 210, 211 is also coupled to the source line through a select gate source transistor 220, 221.

One bit line 203 is shown biased at an inhibit voltage (e.g., $V_{bl}=V_{CC}$). The other bit line 204 is shown biased at a program enable voltage (e.g., $V_{bl}=0V$). Thus, when word line N is biased at $V_{pgm}$ during a block program operation, the memory cell 202 of the series string 210 coupled to the inhibited bit line 203 will be protected from programming. The selected memory cell 201 of the series string 211 coupled to the enabled bit line 204 will be programmed.

In one embodiment, $V_{pgm}$ represents a series of incrementally increasing voltage pulses for programming the memory cells coupled to the enabled bit lines. The memory cells are programmed in blocks, after a block erase operation has occurred, such that every other bit line is programmed and every other bit line is inhibited.

The programming operation is comprised of biasing the selected word line with the first programming pulse at an initial programming voltage (e.g., $V_{pgm}=16V$). A program verify operation is then performed to determine if all of the memory cells on the selected word line have been adequately programmed. If the verify discovers that a memory cell has not been programmed to the desired threshold voltage, the programming voltage is increased by a certain voltage (e.g., 1V) and the selected word line is again biased with this voltage. This repeats until all of the cells of the selected word line have been either programmed or flagged as defective.

The unselected word lines of the memory block being programmed are biased at a $V_{pass}$ voltage that allows the unselected memory cells to act in a pass mode. One embodiment of the method for programming with reduced program disturb biases these unselected word lines with a negative drive program inhibit scheme. As seen in FIG. 2, one such unselected memory cell 200 is coupled to word line 0 that is biased with a signal that initially goes negative then ramps to a higher $V_{pass}$ level. The unselected memory cell 200 and the operation of one reduced program disturb embodiment is illustrated in greater detail in FIG. 3.

Figure 3:
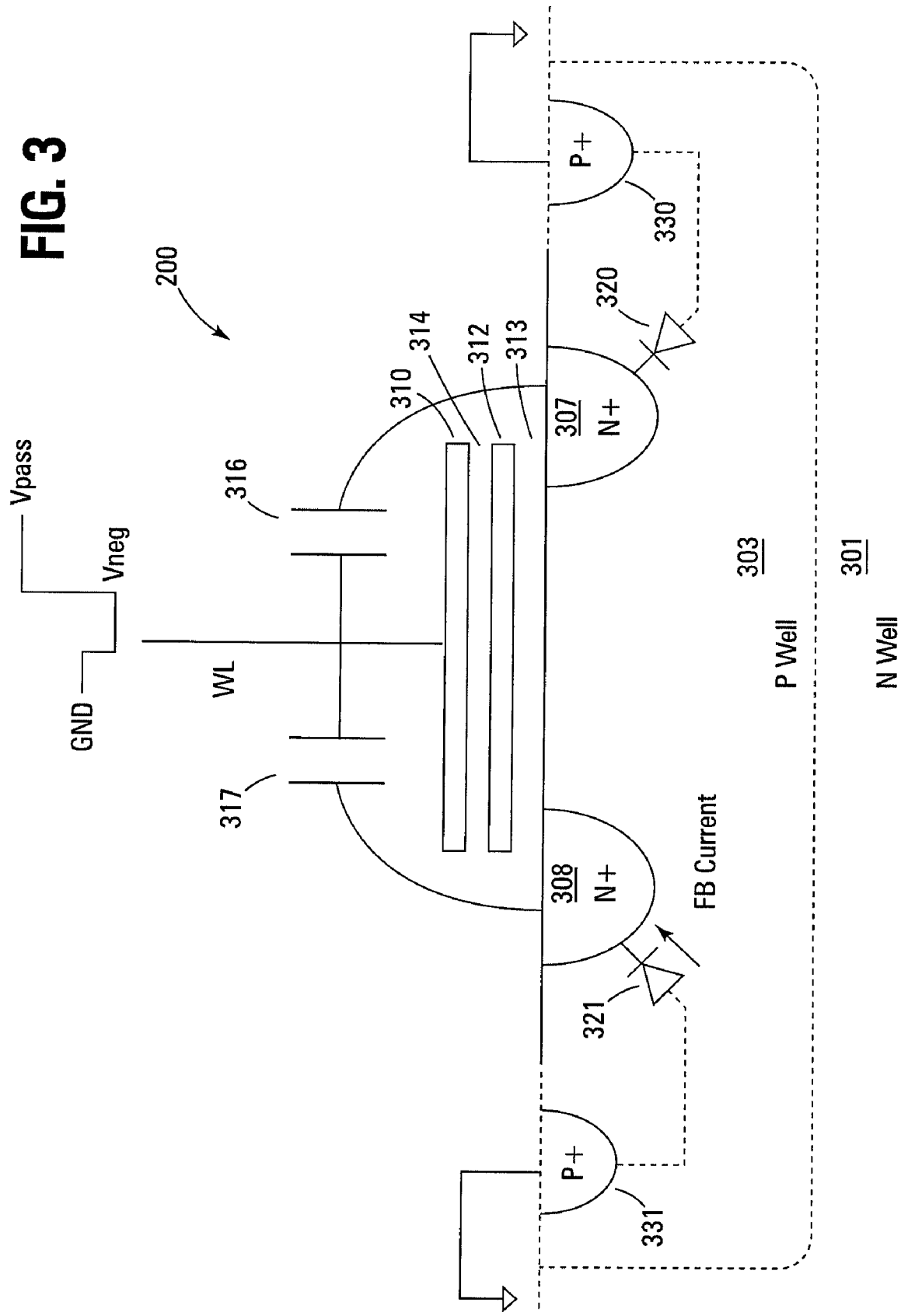
FIG. 3 shows a schematic and cross-sectional representation of one memory cell in accordance with the memory array of FIG. 2.

FIG. 3 illustrates a combination schematic and cross-sectional view of one unselected memory cell 200 of the array of FIG. 2. The illustrated embodiment is a floating gate transistor formed in a substrate in which an n-well 301 is formed. A p-well 303 is formed within the n-well 301.

The transistor is comprised of a pair of source/drain regions 307, 308. The region 307 or 308 that functions as the drain and the region 308 or 307 that functions as the source depends on the biasing of these regions 307, 308.

The gate stack is comprised of a charge storage layer 312 that is typically referred to as the floating gate. This layer 312 is isolated from the substrate by a tunnel insulator 313 and is further isolated from a control gate 310 by a gate insulator 314. Both insulator layers, in one embodiment, are oxides.

The control gate 310 is coupled to each of the source/drain regions 307, 308 by an overlap capacitance 316, 317. The p-junctions at the n+ source/drain regions 307, 308 are represented by the diodes 320, 321 that regions 307, 308 form with the p-well. The diodes 320, 321 are shown coupled to the p-well taps 330, 331.

During a program operation, while the selected word line is biased at $V_{pgm}$, the unselected word lines are initially biased at negative voltage $V_{neg}$. All of the unselected source/drain regions will try to go to $Cc*V_{neg}$ due to coupling where Cc is the coupling ratio (i.e., if the gate voltage is changed by a certain amount, the drain and source voltage change by Cc * gate voltage change). However, the forward biased diodes 320, 321 only allow these regions to go to $-V_{fb}$ (e.g., −1.0V).

Subsequent to the initial negative bias, the unselected word lines are pulled up from the $V_{neg}$ bias to $V_{pass}$. This couples up the source/drain regions of the inhibited series strings to Cc * $(V_{pass}+V_{neg}-V_{fb})$. This provides a voltage swing on the source/drain regions that is larger than a normal prior art $Cc*V_{pass}$ voltage. In practice, the coupling ratio varies depending on the bias condition of the memory device. However, for simplicity of explanation, a fixed coupling ratio is presented here.

In one example of operation, $V_{neg}$ is −4.0V and $V_{pass}$ is 10V. Due to the coupling effect, the source/drain regions will couple up to Cc*13V (i.e., $Cc*(V_{pass}+V_{neg}-V_{fb})$). This has the effect of raising $V_{pass}$ higher than 10V because the $V_{pass}$ swing, instead of being from 0V to 10V, is now a −4V to 10V (i.e., 14V swing). $V_{pass}$ swing can be made even larger by making $V_{neg}$ even more negative. For example, if $V_{neg}$ is −8V and $V_{pass}$ is 8V, this produces a 16V voltage swing making source/drain couple to $Cc*(V_{pass}-V_{neg}-V_{fg})$ which equals Cc*15V where $V_{fb}$ is 1V. Thus, $V_{pass}$ can be reduced, thereby reducing disturb on the unselected cells of the selected bit line along the NAND string; while at the same time reducing the program disturb on unselected cells of the selected word line.

Figure 4:
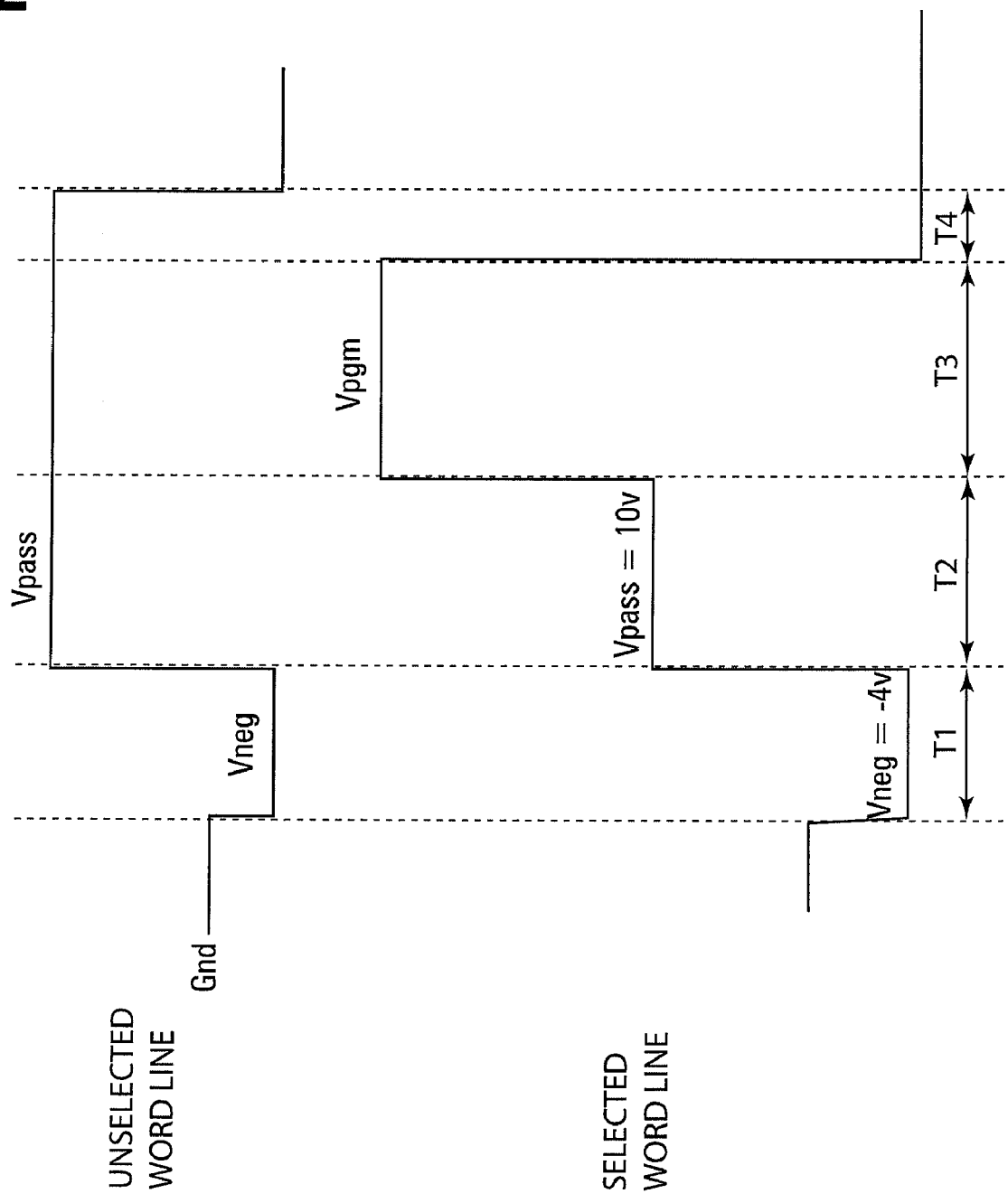
FIG. 4 shows a timing diagram of an alternate embodiment of the word line biasing of the present disclosure.

FIG. 4 illustrates a timing diagram of an alternate embodiment of the method for reducing the effects of program disturb in a memory device. The top signal is the biasing of the unselected word line as described in the previous embodiment. The biasing starts at ground, goes to $V_{neg}$ (e.g., −4.0V) then increases to $V_{pass}$ (e.g., 10V). The times T2 and T4 can be as close to 0 seconds as possible or some other very short time. This is true for both the previous embodiment and the alternate embodiment.

The lower signal is the biasing of the selected word line containing the memory cells to be programmed. In this embodiment, the biasing starts at $V_{neg}$ then ramps up to $V_{pgm}$. T3 can be any typical program time. As in the previous embodiment, this provides a greater program voltage swing on the word line, thus providing a larger effective $V_{pgm}$. The select gate drain voltage ($V_{sgs}$), select gate source voltage ($V_{sgd}$), the source voltage ($V_{source}$), and the bit line voltage ($V_{bl}$) bias conditions can all be set so as to reduce gate induced drain leakage (GIDL).

Figure 5:
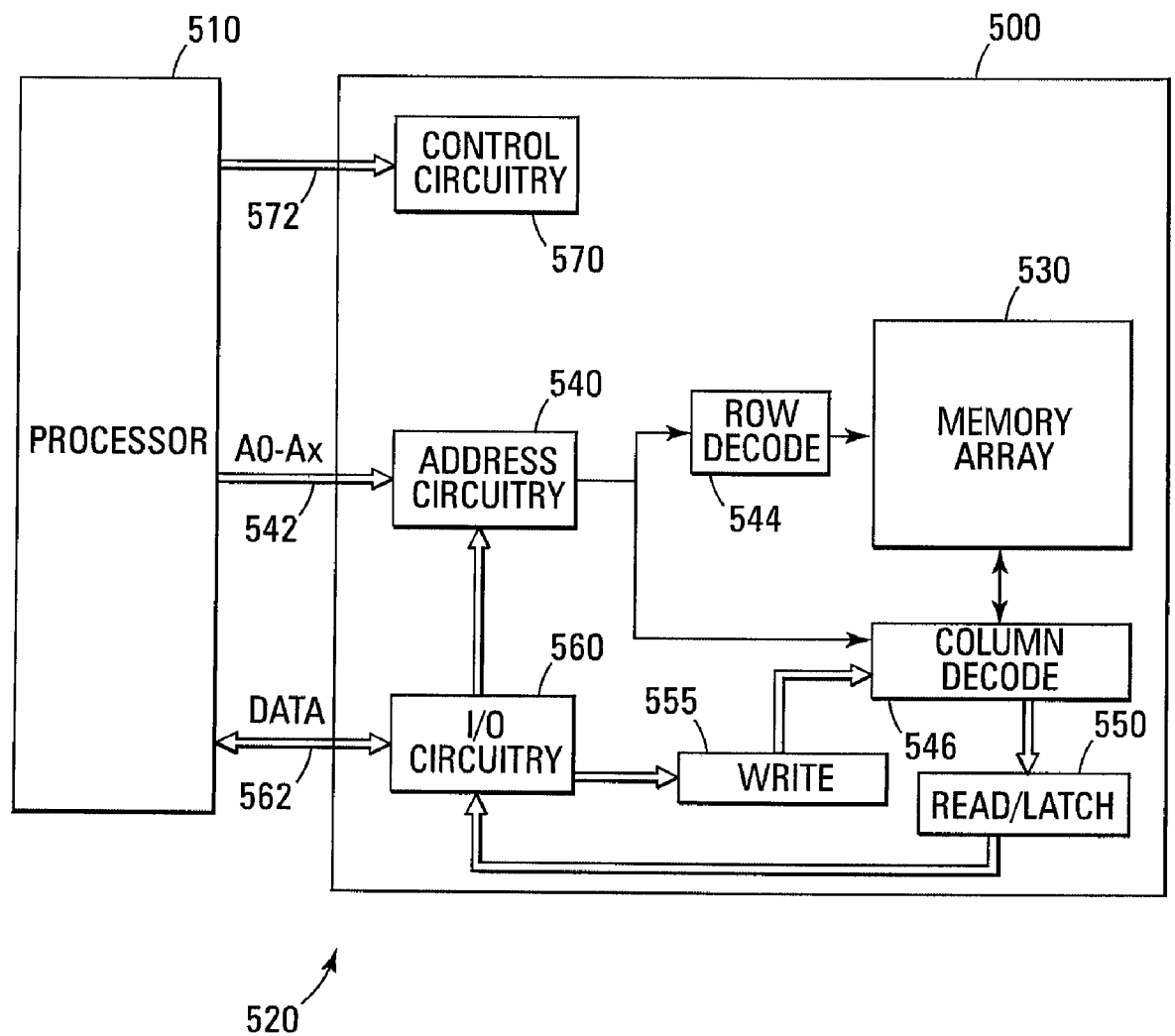
FIG. 5 shows a block diagram for one embodiment of a memory system of the present invention.

FIG. 5 illustrates a functional block diagram of a memory device 500 that can incorporate the non-volatile memory cells of the present invention. The memory device 500 is coupled to a processor 510. The processor 510 may be a microprocessor or some other type of controlling circuitry. The memory device 500 and the processor 510 form part of a memory system 520. The memory device 500 has been simplified to focus on features of the memory that are helpful in understanding the present invention.

The memory device includes an array of flash memory cells 530 or some other type of non-volatile memory cells. The memory array 530 is arranged in banks of rows and columns. The control gates of each row of memory cells is coupled with a word line while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 540 is provided to latch address signals provided on address input connections A0-Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense amplifier/buffer circuitry 550. The sense amplifier/buffer circuitry, in one embodiment, is coupled to read and latch a row of data from the memory array 530. Data input and output buffer circuitry 560 is included for bi-directional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write, and erase operations. The control circuitry 570 may be a state machine, a sequencer, or some other type of controller. The control circuitry 570 is adapted to execute the embodiments of the program disturb reduction method.

The non-volatile memory device illustrated in FIG. 5 has been simplified to facilitate a basic understanding of the features of the memory and is for purposes of illustration only. A more detailed understanding of internal circuitry and functions of non-volatile memories are known to those skilled in the art.

CONCLUSION

In summary, one or more embodiments of the present disclosure provide reduced program disturb effects during a block program operation in a non-volatile memory device. For example, unselected word lines are initially biased with a negative voltage prior to biasing with $V_{pass}$. This produces a larger voltage coupling effect on the source and drain of unselected word line cells thus reducing the program disturb.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a memory block, the method comprising:
    initially biasing unselected word lines of the memory block at a negative voltage;
    biasing the unselected word lines at a positive pass voltage subsequent to the negative voltage; and
    biasing a selected word line with a positive voltage.

2. The method of claim 1 and further including biasing each inhibited bit line at $V_{CC}$ and each program enabled bit line at 0V.

3. The method of claim 1 wherein a time between the negative voltage and the positive pass voltage is substantially close to 0 seconds.

4. The method of claim 1 wherein the positive voltage is comprised of a series of incrementally increasing voltage pulses.

5. The method of claim 1 wherein biasing the selected word line comprises:
    biasing the selected word line initially with a negative voltage; and
    biasing the selected word line with the positive voltage subsequent to the negative voltage.

6. The method of claim 5 wherein a time between the negative voltage and the positive voltage is substantially close to 0 seconds.

7. A method for programming a memory block in a non-volatile NAND memory device, the method comprising:
    biasing each of a plurality of unselected word lines of the memory block first with a negative $V_{neg}$ voltage and with a positive $V_{pass}$ voltage subsequent to the negative voltage; and
    generating at least one programming voltage pulse on a selected word line.

8. The method of claim 7 and further comprising performing a program verify operation after each programming voltage pulse.

9. The method of claim 7 wherein the memory block is comprised of a plurality of memory cells, each memory cell having a source and a drain region that is coupled to the negative $V_{neg}$ voltage with a relationship of $Cc*V_{neg}$ where Cc is a coupling ratio of the memory cell.

10. The method of claim 9 wherein the source and drain regions are coupled to the positive $V_{pass}$ voltage with a relationship of $Cc*(V_{pass}+V_{neg}-V_{fb})$ where $V_{fb}$ is a forward bias voltage of a diode formed by one of the source or the drain region with a surrounding p-well.

11. A semiconductor, non-volatile memory device, comprising:
    a memory array comprising a plurality of memory cells; and
    a memory controller, coupled to the memory array, for controlling operation of the memory array wherein the memory controller is configured to initially bias, during a programming bias sequence, a memory block of unselected word lines with a negative voltage and subsequently bias the unselected word lines with a positive voltage, the controller further configured to control biasing of a selected word line during the programming sequence with a negative voltage followed by a positive voltage.

12. The memory device of claim 11 wherein the programming bias sequence is comprised of a plurality of incrementally increasing programming pulses such that each programming pulse is preceded by a negative voltage.

13. The memory device of claim 12 wherein the memory controller is further adapted to generate a verify operation between each of the incrementally increasing programming pulses.

14. The memory device of claim 11 and further comprising an external processor coupled to the memory device wherein the memory device and processor form a memory system.

15. The memory device of claim 11 wherein the memory array is comprised of one of a NAND architecture or a NOR architecture.

16. The memory device of claim 11 wherein the memory controller is further adapted to generate bit line bias voltages that include a bit line inhibit voltage and a bit line program enable voltage.

* * * * *